(12) United States Patent
Yoshimizu et al.

(10) Patent No.: US 6,495,932 B1
(45) Date of Patent: Dec. 17, 2002

(54) DC POWER SOURCE UNIT

(75) Inventors: Chikai Yoshimizu, Hitachinaka (JP); Hiroaki Orikasa, Hitachinaka (JP); Takahiko Shimada, Hitachinaka (JP); Shigeru Shinohara, Hitachinaka (JP); Eiji Nakayama, Hitachinaka (JP); Kazuhiko Funabashi, Hitachinaka (JP); Atsushi Nakagawa, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 0 days.

(21) Appl. No.: 09/478,798

(22) Filed: Jan. 7, 2000

Related U.S. Application Data

(63) Continuation-in-part of application No. 09/161,379, filed on Sep. 28, 1998, now Pat. No. 6,172,860.

(30) Foreign Application Priority Data

Sep. 26, 1997 (JP) ............................... 9-261983
Mar. 13, 1998 (JP) ............................... 10-62937

(51) Int. Cl.[7] .................................................. H02J 7/00
(52) U.S. Cl. ........................ 307/150; 307/154; 307/134
(58) Field of Search ............................... 307/150, 154, 307/151, 134, 116, 125, 126, 130, 131; 340/310.08

(56) References Cited

U.S. PATENT DOCUMENTS

| | | | | |
|---|---|---|---|---|
| 4,835,409 A | * | 5/1989 | Bhagwat et al. | 307/64 |
| 4,835,410 A | | 5/1989 | Bhagwat et al. | 307/64 |
| 4,847,513 A | | 7/1989 | Katz et al. | 307/149 |
| 4,945,467 A | | 7/1990 | Bhagwat | 363/132 |
| 5,220,478 A | | 6/1993 | Innes et al. | 361/93 |
| 5,297,015 A | * | 3/1994 | Miyazaki et al. | 307/151 |
| 5,635,806 A | | 6/1997 | Wissmach et al. | 318/245 |
| 5,680,026 A | * | 10/1997 | Lueschen | 320/2 |
| 5,715,156 A | * | 2/1998 | Yilmaz et al. | 363/142 |
| 5,929,597 A | * | 7/1999 | Pfeifer et al. | 320/107 |
| 6,005,489 A | * | 12/1999 | Siegle et al. | 340/825.69 |
| 6,007,940 A | * | 12/1999 | Spotnitz | 429/99 |
| 6,087,815 A | * | 7/2000 | Pfeifer et al. | 323/282 |
| 6,104,162 A | * | 8/2000 | Sainsbury | 320/11 |
| 6,106,971 A | * | 8/2000 | Spotnitz | 429/98 |
| 6,127,860 A1 | * | 1/2001 | Yoshimizu et al. | 361/25 |
| 6,243,276 B1 | * | 6/2001 | Neumann | 363/53 |

* cited by examiner

*Primary Examiner*—Fritz Fleming
(74) *Attorney, Agent, or Firm*—Sughrue Mion, PLLC

(57) ABSTRACT

A DC power source unit includes a main unit that generates DC voltage, and an output cable. The output cable is connected, either integrally or detachably, at one end to the output of the main unit and another end to an adapter plug. The adapter plug is electrically connected to an electrically powered tool, such as an electrical drill. An output voltage switching unit switches the level of voltage supplied by the main unit to the electrically powered tool, to a level that matches the rated voltage of the electrically powered tool that corresponds to the fitting portion of the adapter plug.

7 Claims, 12 Drawing Sheets

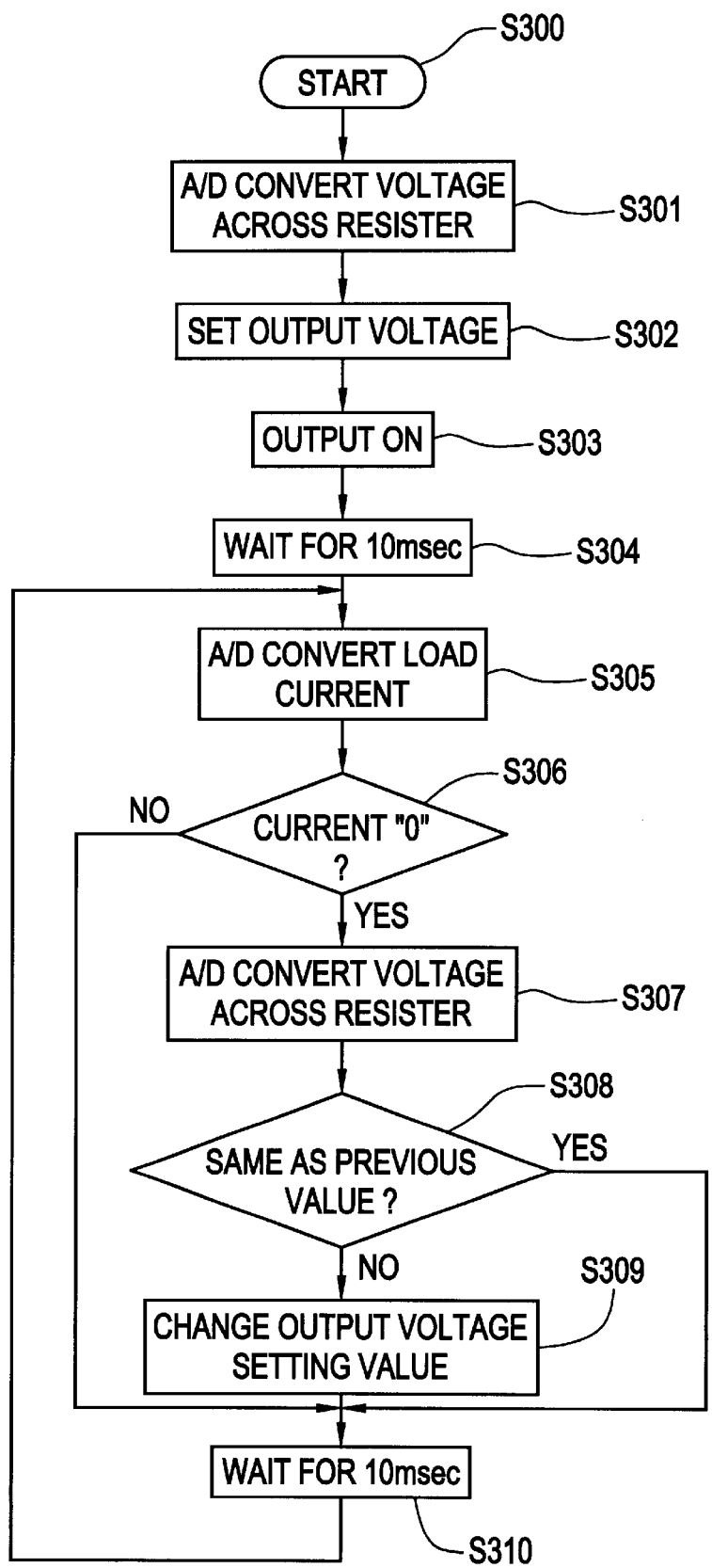

DC POWER SOURCE UNIT

CROSS-REFERENCE TO RELATED APPLICATION

This application is a continuation-in-part application of Ser. No. 09/161,379 filed Sep. 28, 1998, now U.S. Pat. No. 6,172,860.

BACKGROUND OF THE INVENTION

1. Field of the Invention

The present invention relates to a DC power source unit that can be used for cordless electrically powered tools.

2. Description of the Related Art

Cordless electrically powered tools, such as electrical drills, can be used any place and are easy to use because no power source cables are required. However, the use of batteries invites some disadvantages. When the charge remaining in the batteries drops to less than an allowable limit, the batteries need to be replaced or recharged. Further, because the battery voltage gradually drops as the use of the battery progresses, the tool's operation efficiency is not constant.

FIGS. 1 and 2 show a conventional DC power source unit suitable only for situations wherein the tool is used close to an AC power source and when work with the tool can be accomplished in a single location without the need to move the tool to different areas. The DC power source unit includes an AC/DC converting box 50, an input cable 57, and an output cable 54. The input cable 57 has one end connected to the converting box 50 and another end attached to a plug 56. The plug 56 is used for connection to an AC power source. The output cable 54 has one end connected to the converting box 50 and another end attached to an adapter plug 55. The adapter plug 55 is detachably connected to the electrically powered tool. As shown in FIG. 2, the converting box 50 includes a transformer 51 for dropping the AC 100 volts to ten and several volts, a rectifier 52 for rectifying the AC voltage to a DC voltage, and a smoothing capacitor 53 for smoothing the waveform of the rectified voltage.

With the DC power source unit shown in FIGS. 1 and 2, the AC voltage supplied from a commercial outlet is converted to a DC voltage to be supplied to the tool. Such a DC power source unit allows the continuous use of tools, thereby ensuring constant work efficiency.

The motors contained in electrically powered tools do not heat up significantly when the tool is driven with batteries. For this reason, the battery powered tools are, generally, not provided with motor cooling fans. Even if the fans are provided, they are small size fans.

When a tool is driven using the conventional DC power source unit, the tool tends to be used continuously for a long period of time, causing the temperature of the motor to rise significantly. This shortens the service life of the motor or the tool. To overcome the above problem, one solution would be providing a large-size cooling fan within the electrically powered tool. However, a large-size cooling fan would increase the overall size of the tool. Large size tools are not desirable for the operator to handle or operate. Another solution to this problem would be providing a temperature sensor in the tool to monitor an abnormal temperature rise within the tool. Power supply to the motor can be controlled in response to the output of the sensor. However, it is difficult to add a new component to the electrical circuitry of the tool and to modify control circuitry of the tool. Even if such addition and modification of the control circuit were made, the resultant electrical arrangement would be complicated.

Some conventional power tools are provided with an internal DC power supply unit. However, the power tools must be made in a large size to accommodate the internal DC power supply unit. Also, the power tools are heavy because the internal DC power supply unit adds to the overall weight of the power tools. Further, because the DC power supply unit is provided internal to a particular power tool, that DC power supply unit can not be used for any other power tools.

SUMMARY OF THE INVENTION

In view of the foregoing, it is an object of the present invention to provide an improved DC power source unit that is suitable for use in electrically powered tools.

Another object of the present invention is to provide a DC power source unit that minimizes shortening of the service life of electrically powered tools.

Still another objective of the present invention is to provide a DC power supply unit that is easy to use, and that can be easily used with a great variety of power tools for supplying power to the power tools.

To achieve the above and other objects, several types of DC power source units are provided for supplying DC voltage to an electrically powered tool.

According to one aspect of the present invention, a DC power source unit for supplying DC voltage to an electrically powered tool, includes a main unit, an adapter plug, an output cable, and output voltage switching means. The main unit has an output and produces DC voltage from the output. The adapter plug has a fitting portion adapted for electrically coupling with the electrically powered tool. The output cable is attached, either integrally or detachably as described below, at one end to the main unit and at another end to the adapter plug. The output voltage switching means is for switching a level of voltage supplied by the main unit to the electrically powered tool, to a level that matches rated voltage of the electrically powered tool that corresponds to the fitting portion of the adapter plug.

A battery pack can be provided for supplying DC voltage to the electrically powered tool. In this case, it is desirable that the battery pack include a fitting portion that is shaped substantially the same as the fitting portion of the adapter plug.

The output cable can be either integrally connected to or detachably engaged with the adapter plug. When integrally connected, it is desirable that the output cable be detachably engaged with the main unit. In this case, a connector that is integrally connected to the output cable is provided for detachably connecting the output cable to the main unit. A voltage setting means is housed in the connector. The voltage setting means corresponds to the rated voltage of the electrically powered tool that corresponds to the adapter plug integrally connected to the other end of the output cable. The output voltage switching means switches the level of supplied voltage according to the voltage setting means, upon connection of the connector to the main unit.

When the output cable is detachably engaged with the adapter plug, it is desirable that the adapter plug house therein a voltage setting means corresponding to the rated voltage of an electrically powered tool that corresponds to the adapter plug. In this case, the output voltage switching means switches the level of voltage according to the voltage setting means, upon coupling of the adapter plug to the electrically powered tool.

A plurality of adapter plugs can be provided in a one-to-one correspondence with a plurality of electrically powered tools. In this case, each adapter plug is shaped to enable coupling with a corresponding electrically powered tool that has a corresponding rated voltage, and is also shaped to prevent coupling with all non-corresponding electrically powered tools that have a non-corresponding rated voltage. Also, a connector is provided for detachably connecting the cable to each adapter plug. The connector is adapted to connect to all adapter plugs regardless of the rated voltage of the corresponding electrically powered tool. It is particularly beneficial in this case, that each adapter plug house therein a corresponding voltage setting means as described above.

According to another aspect of the invention, a DC power source unit includes a main unit that has an output and produces DC voltage from the output, an adapter plug that is electrically coupled to the electrically powered tool in use, a connector that is electrically connected to the output of the main unit, and an output cable having one end attached to the adapter plug and another end attached to the connector. An output voltage setting means is also provided in the adapter plug for setting a level of voltage to be supplied to the electrically powered tool. The level of voltage set by the output voltage setting means corresponds to a rated voltage of the electrically powered tool. A load current detection means is also provided for detecting a load current flowing in the electrically powered tool and outputs a detection signal indicative of the load current. An output voltage changeover means is also provided for changing over the level of voltage to be supplied to the electrically powered tool in response to the level of voltage set by the output voltage setting means. A control means is provided for transmitting the level of the voltage set by the output voltage setting means to the output voltage changeover means based on the detection signal output from the load current detection means. The adapter plug may be detachably connected to the one end of the output cable. Preferably, the output voltage setting means is a resistor.

BRIEF DESCRIPTION OF THE DRAWINGS

The above and other objects, features and advantages of the invention will become more apparent from reading the following description of the preferred embodiment taken in connection with the accompanying drawings in which:

FIG. 8(*b*) is a graphical representation showing a relationship between time versus motor temperature;

FIG. 8(*c*) is a graphical representation showing a relationship between time and current flowing in the electrically powered tool;

FIG. 17 is a flow chart illustrating a program for operating the DC power source unit of the sixth embodiment of the present invention.

DETAILED DESCRIPTION OF THE PREFERRED EMBODIMENTS

Figure 1:
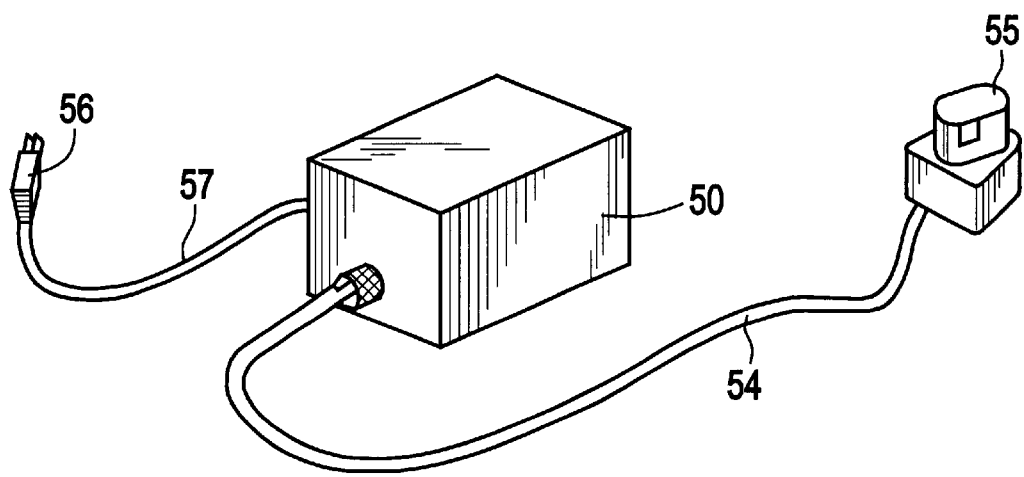
FIG. 1 is a perspective view showing a conventional DC power source unit.
Figure 2:
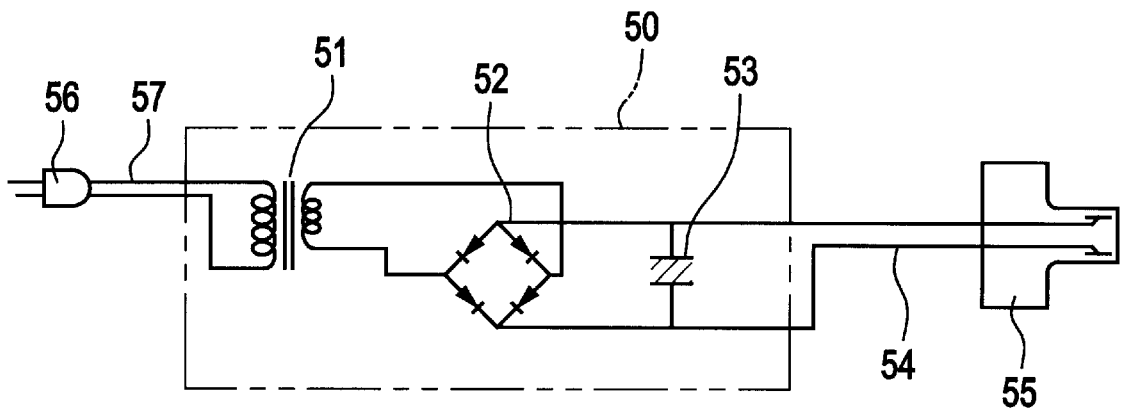
FIG. 2 is a circuit diagram of the DC power source unit shown in FIG. 1.

The present invention will be described with reference to preferred embodiments in which a portable electric drill is taken as an example of electrically powered tools. The electric drill, of course, should be understood as merely illustrative of the electrically powered tools, and not in any way limiting. In the following description, the same reference numerals denote similar components.

Figure 4:
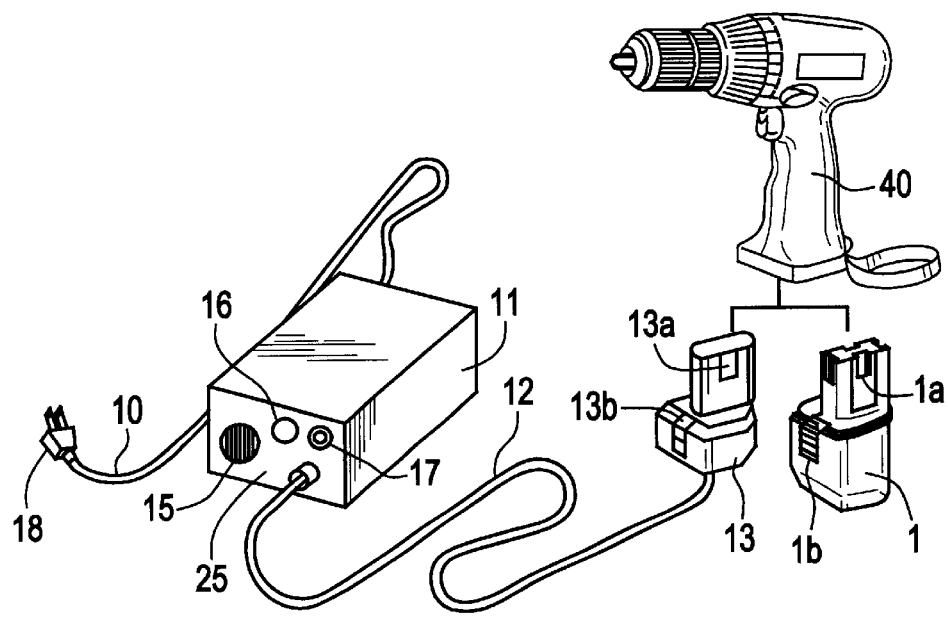
FIG. 4 is a perspective view showing the DC power source unit shown in FIG. 3 and also a portable electrical drill.

As shown in FIG. 4, a DC power source unit according to the first embodiment of the present invention includes a main unit 11, an input cable 10 and an output cable 12. The input cable 10 has one end connected to the main unit 11 and another end attached to a plug 18 to be inserted into a socket from a commercial AC 100 volt power supply. The output cable 12 has one end connected to the main unit 11 and another end attached to an adapter plug 13. The adapter plug 13 has a protruded portion that is the same shape as a battery pack 1 for use in an electrical drill 40. The adapter plug 13 as well as the battery unit 1 can be detachably mounted to the electrical drill 40. The adapter plug 13 is formed with a terminal 13*a* for electrical connection of the tool 40 and a latch 13*b* for preventing disengagement of the adapter plug 13 from the tool 40. Similarly, the battery unit 1 is formed with a terminal 1*a* and a latch 1*b*.

Figure 3:
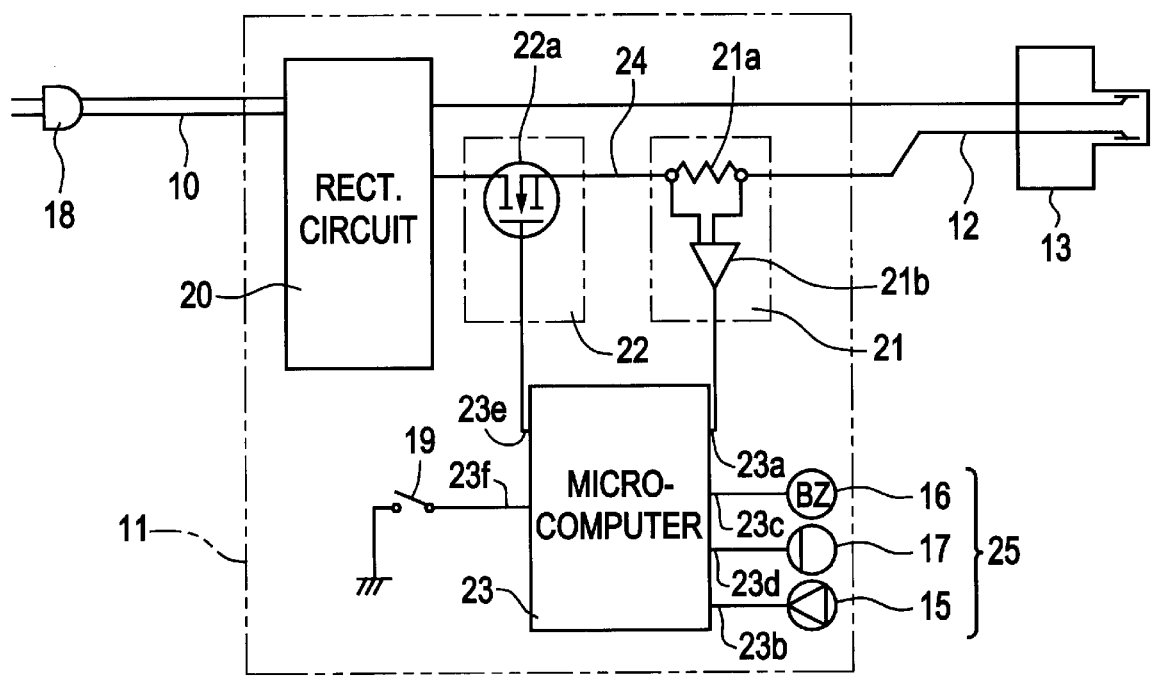
FIG. 3 is a circuit diagram of a DC power source unit according to a first embodiment of the present invention.

A first embodiment of the present invention will now be described while referring to FIGS. 3 through 6. FIG. 3 shows an electrical circuitry of the main unit 11 according to the first embodiment. As shown, the main unit 11 includes a rectifying circuit 20, a switching circuit 22, a microcomputer 23, and a detection circuit 21. The rectifying circuit 20 is connected to the commercial AC 100 volt power supply through the input cable 10 and converts an AC voltage to a DC voltage. One input of the switching circuit 22 is connected to the output of the rectifying circuit 20 and the output of the switching circuit 22 is connected to the detection circuit 21. The switching circuit 22 includes an FET 22a that is rendered OFF in response to a signal fed to the gate of the FET 22 from the output port 23e of the microcomputer 23. The detection circuit 21 includes a resistor 21a and an operational amplifier 21b that amplifies a voltage developed across the resistor 21a. The output of the operational amplifier 21b is connected to the input port 23a of the microcomputer 23. A speaker 15, a buzzer 16 and a lamp 17, which constitute an alarm section 25, are connected to the output ports 23b, 23c and 23d of the microcomputer 23, respectively. The output of the detection circuit 21 is connected to the adapter plug 13 through the output cable 12.

Operation of the DC power source unit shown in FIG. 3 will be described while referring to the flowchart shown in FIG. 5. In the following description, Si indicates the step number of the flowchart.

When the plug 18 is connected to the commercial AC power supply, the microcomputer 23 starts executing the program (S100). Upon the program being started, an initialization process is carried out (S101). The initialization process includes resetting the ports of the microcomputer 23 and an accumulated electrical quantity M and also initialization of a maximum value Mmax. The maximum value Mmax represents the maximum electrical quantity that can be consumed by the electrical drill when driven continuously. This value is determined based on an amount of heat generated by the motor of the electrical drill and the heat radiating characteristic of the electrically powered tool.

After the initialization process is completed, a 10 msec counter is started to count up (S102). Next, whether or not 10 msec has elapsed is determined (S103). If it is determined that 10 msec has elapsed, the program proceeds to S104 where current flowing into the electrical drill is detected and subjected to A/D (analog-to-digital) conversion and a resultant current value is read. In S105, the current value detected in S104 is multiplied by 10 msec to obtain an electrical quantity ΔM supplied to the electrical drill 40 and consumed thereby during 10 msec. It should be noted that the electrical quantity ΔM is an integrated value of current with respect to time in units of Ah (Ampere hour).

Next, an updated accumulated electrical quantity M is computed by retrieving an accumulated electrical quantity M from memory and adding it to the electrical quantity ΔM (S106). Afterwards, the 10 msec counter is cleared (S107). In S108, the updated accumulated electrical quantity M is compared with 90% of the maximum value Mmax. If the accumulated electrical quantity M is less that 90% of the maximum value Mmax, i.e., M<0.9×Mmax, then the routine returns to S102. On the other hand, if the accumulated electrical quantity M is equal to or greater than 90% of the maximum value Mmax, i.e., M<0.9×Mmax, the routine proceeds to S109 where the accumulated value M is compared with the maximum value Mmax. If the comparison results of S109 indicate that the accumulated value M is less than the maximum value Mmax, i.e., M<Mmax, then the routine proceeds to S110 where currents are supplied to the output ports 23b, 23c and 23d to turn on the alarm section 25. When the alarm section 25 turns on, then an announcement voice message is produced from the speaker 15. An example of the voice message is "The tool has overheated. Please stop the tool until it has sufficiently cooled". At the same time, the buzzer 16 generates an alarm sound and the lamp 17 is lit.

When the user continues to use the electric drill 40 under the situation where the alarm section 25 is ON (S108:Yes), it is determined whether or not the accumulated value M is equal to or greater than the maximum value Mmax (S109). If so, the FET 22a of the switching circuit 22 is rendered OFF in response to a signal output from the output port 23e of the microcomputer 23, so that the current flowing in the electrical drill 40 is interrupted (S111). Thereafter, when it is determined that the reset switch 19 is ON, the routine proceeds to S113 and then returns to S100.

As described, power supply to the electric drill 40 is interrupted before the motor temperature becomes exceedingly high even if the electrical drill 40 is continuously driven using the DC power source unit 11. As such, the service life of the motor and the electrical drill 40 will not be excessively shortened caused by overheating. Further, the alarm section 25 gives the user advance warning before interruption of the power supply to the electrical drill 40. Therefore, the user can recognize the situation and comprehend the reason why the electric drill is suddenly stopped.

Figure 8A:
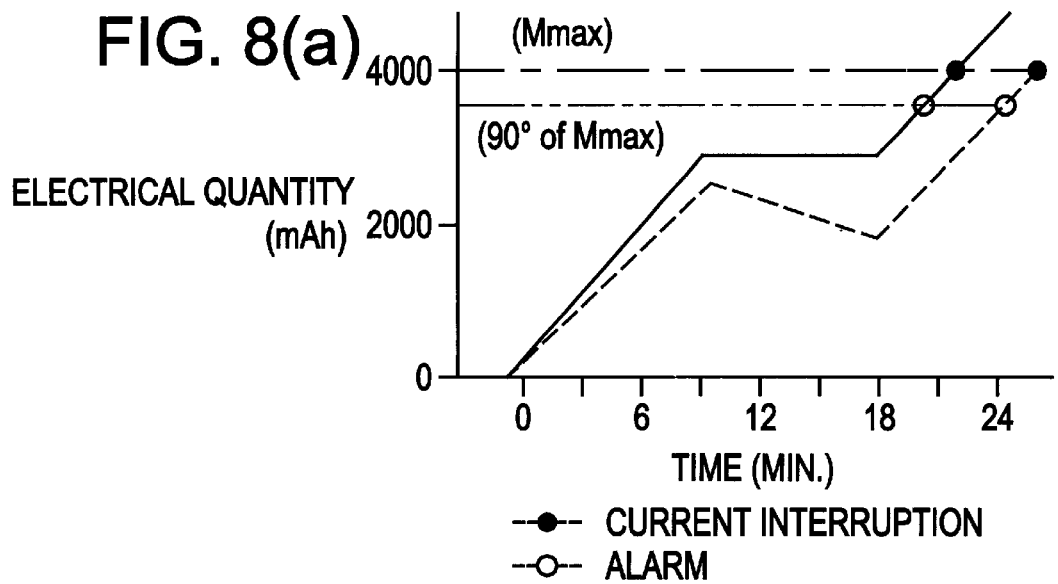
FIG. 8(*a*) is a graphical representation showing a relationship between time and accumulated electrical quantity stored in a memory of a microcomputer included in the DC power source unit.
Figure 8B:
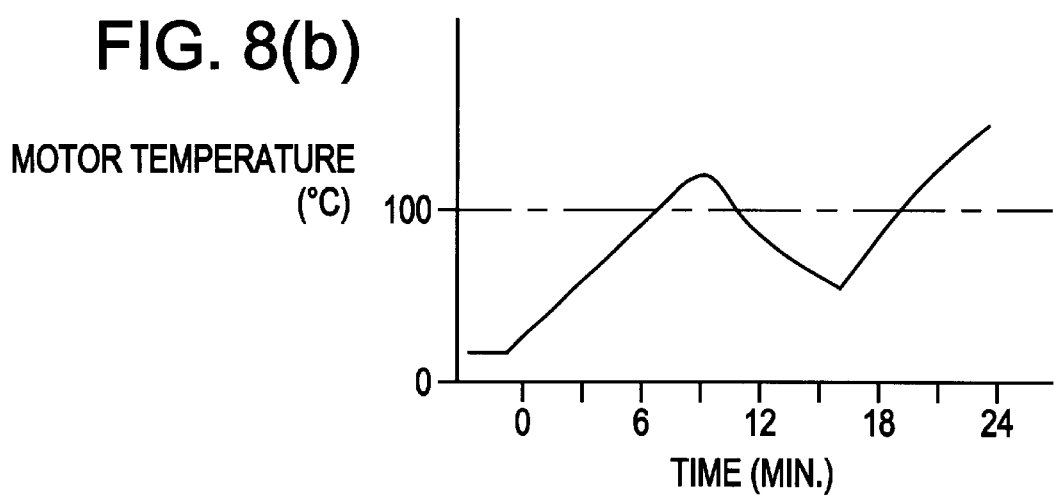
Figure 8C:
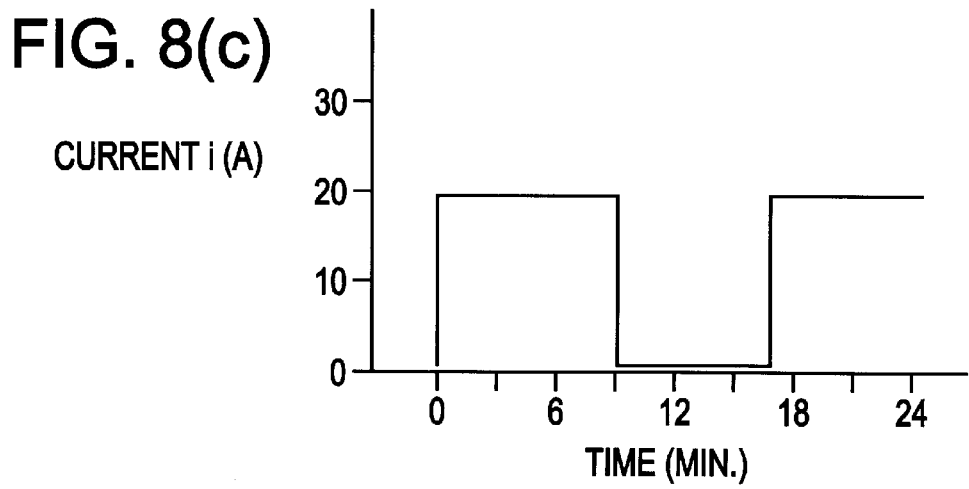

Another program for use in the first embodiment of the present invention will next be described while referring to the flowchart shown in FIG. 6. This program is prepared as an improvement of the above-described program. The following program takes into account that the motor temperature will cool when the electrical drill 40 is not used for some time. As denoted by solid lines in FIGS. 8(a) through 8(c), in the previous program, the accumulated electrical quantity M increases while the drill is being driven. When current i of the drill is interrupted as shown in FIG. 8(c), the increase is halted so that as shown in FIG. 8(a) the accumulated electrical quantity M is maintained at a level immediately before the interruption. The M starts increasing when the current supply is resumed. However, as shown in FIG. 8(b), the heated motor naturally cools down during non-use periods of the drill. Therefore, according to the previous program, the alarm process may be implemented and the current may be forcibly interrupted even though the motor temperature has not yet actually reached an abnormally high level as indicated by a solid line in FIG. 8(a).

Figure 5:
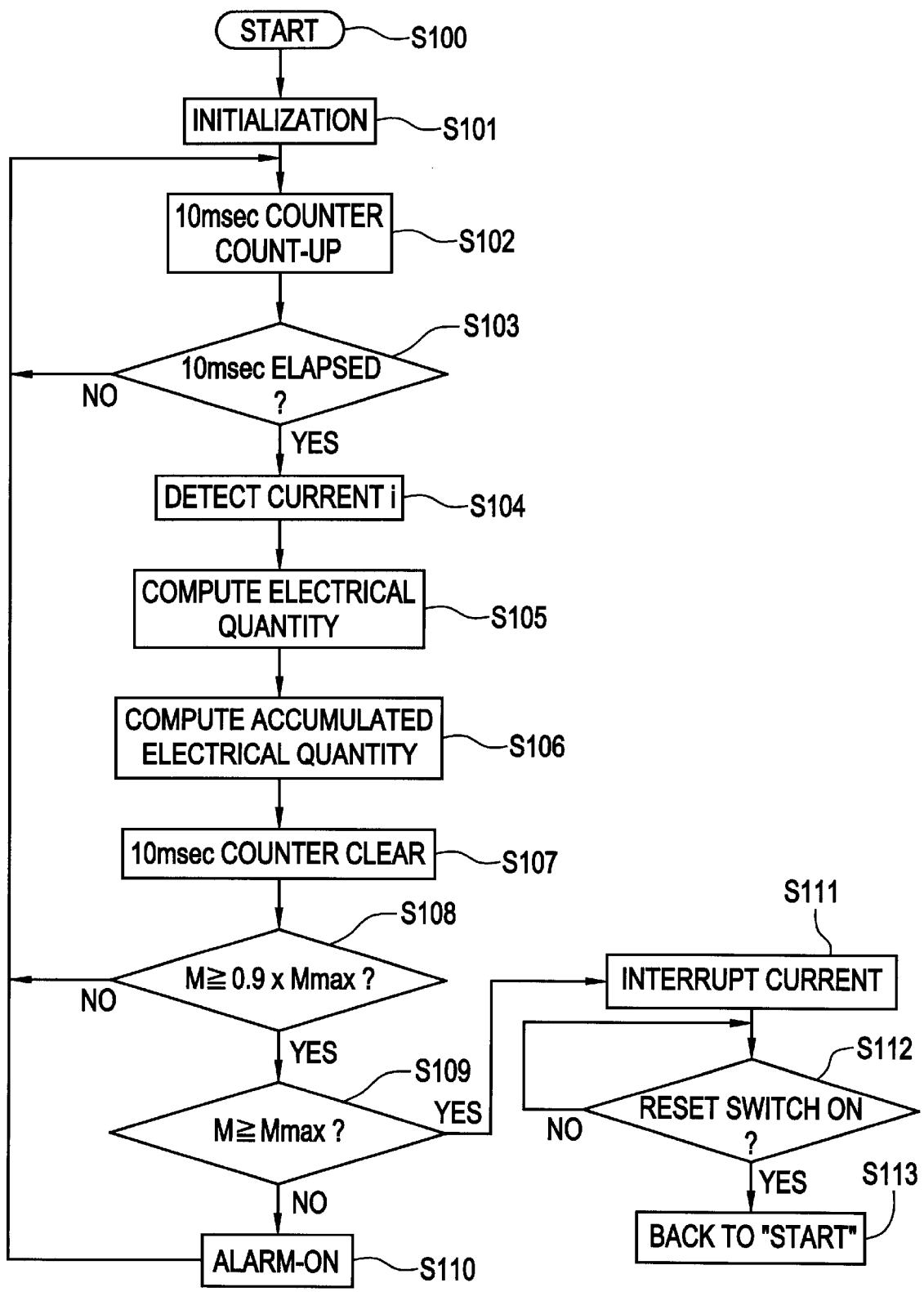
FIG. 5 is a flowchart illustrating a program for operating the DC power source unit of the first embodiment of the present invention.
Figure 6:
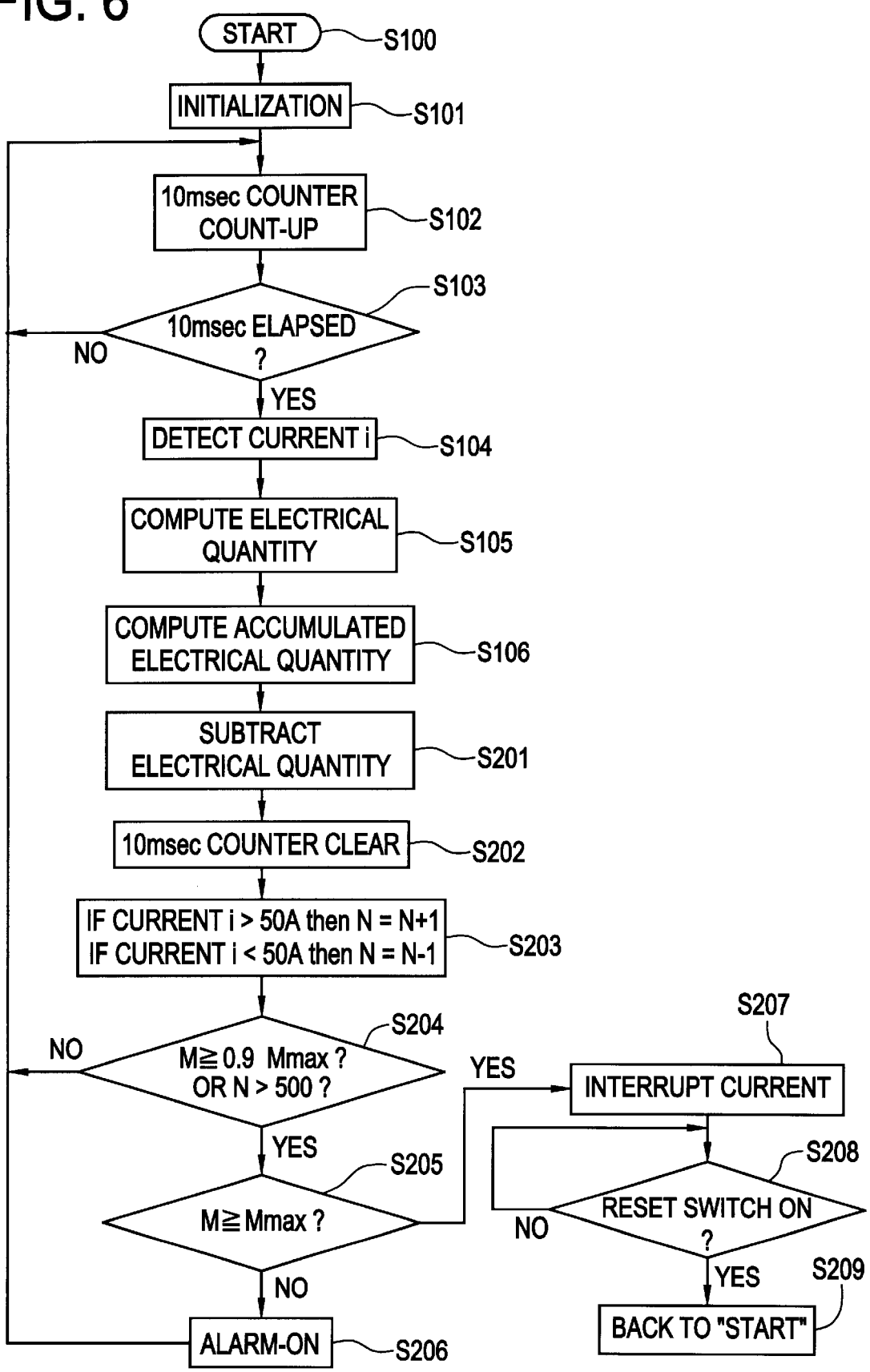
FIG. 6 is a flowchart illustrating another program for operating the DC power source unit of the first embodiment of the present invention.

In the flowchart of FIG. 6, the processes executed in S100 through S106 are identical to the same numbered steps in the flowchart of FIG. 5. Therefore, previously described steps will be omitted here. After the accumulated electrical quantity M is obtained in S106, then in S201 the electrical quantity Mh is subtracted from electrical quantity M. Subtraction of Mh is carried out every 10 msec regardless of whether the electrical drill 40 is being used or not. In this program, the value Mh is set to 0.0111 mAh. Because the value Mh is set to such a small value, the result of modified calculation of the accumulated electrical quantity M performed when the drill 40 is continuously being driven does not differ greatly from the accumulated electrical quantity calculated without performing subtraction. When the drill 40 is not used, that is, while the heated motor is naturally cooling down, the accumulated electrical quantity M gradually decreases. In this manner, the value Mh is set to a small value relative to increasing electrical quantity when no cooling fan is provided as in this embodiment. However, if a cooling fan is provided, Mh is selected to be a value larger than the value mentioned above. With such a modified calculation of the accumulated electrical quantity, the change in the accumulated electrical quantity generally follows the change in the motor temperature as indicated by a broken line in FIG. 8(a). Therefore, optimal temperature control can be achieved.

Even if the motor temperature increases to an exceedingly high temperature because the electrical drill is used continuously for a long time, a rest time of one hour or so is sufficient for the electrical drill to naturally cool so that the heated temperature returns to a normal temperature. The value of 0.0111 mAh for the parameter Mh is selected so that the accumulated electrical quantity M is reduced from 4000 mAh to approximately 0 mAh when the non-use time continues for one hour. It should be noted that the minimum accumulated electrical quantity is zero even if the total subtract value exceeds the accumulated electrical quantity M to be subtracted by Mh.

In S203 and S204 of the flowchart in FIG. 6, the alarm section 25 is turned on when a high level current flows continuously in the electric drill 40 for some reason. This prevents the service life of the motor from being shortened by such an unexpected cause. If a high level current flows in the electrical drill 40 for about 20 seconds, the temperature of commutator, carbon brush and windings raises to an exceedingly high temperature, damaging the electrical drill. In S203, the level of the current i flowing in the motor is monitored. When the current i is greater than 50 Amp, the count number N is incremented by one whereas when the current i is less than 50 Amp, the count number N is decremented by one. In S204, it is determined whether or not the count number N is greater than 500. When the determination made in S204 indicates that the count number N is greater than 500, the routine proceeds to S205 and then to S206 where the alarm section 25 is turned on. The count number N is set so that the count number does not become less than zero. While in this example, the alarm section 25 is turned on when the count number N becomes greater than 500, power for driving the electrical drill 40 may be interrupted instead.

Operation of the DC power source unit according to the second program described above will be described while showing specific examples. In the following examples, when $\Delta M$ is equal to or less than zero, $\Delta M$ will be treated as zero. Further, the accumulated electrical quantity is assumed to be zero at the start of drilling.

EXAMPLE 1

The time duration that the electrical drill 40 can be continuously used will be calculated assuming that the drill 40 is continuously driven with a current of 20 Amp flowing therein. The calculated time duration is from the start of drilling to the interruption of power supply to the drill which occurs when the accumulated electrical quantity M exceeds the maximum value Mmax.

Electrical quantity $\Delta M$ to be added to the accumulated electrical quantity M after elapse of every 10 msec interval is determined by the following equation:

$$(I \times 10 \text{ mse}) - Mh = (20 \text{ A} \times 0.01 \text{ sec}/3600 - 0.0111 \text{ mAh}$$

$$= 0.0444 \text{ mAh}$$

The number of times n the 10 msec counter counts during a time duration from the start of drilling to just when the accumulated electrical quantity exceeds the maximum value max of 4000 mAh is obtained by the following calculation:

$$n = M\text{max}/\Delta M = 4000/0.0444 = 90090$$

Accordingly, the time duration is about 15 minutes (i.e., 10 msec×90090=900.9 sec≈15 min). That is, after about fifteen minutes from the start of drilling, the power supply to the drill 40 is forcibly interrupted.

EXAMPLE 2

The drill 40 is driven for 10 seconds with a current of 20 Amp flowing therein and is stopped for 20 seconds. When this drive/stop cycle is repeatedly carried out, a time duration from the start of drilling to the forcible stop of the power supply is calculated.

Electrical quantity $\Delta M1$ to be added at every 10 msec interval to the accumulated electrical quantity M during 10 seconds is determined using the following equation:

$$(20 \text{ A} \times 0.01 \text{ sec}/3600) - 0.0111 \text{ mAh} = 0.0444 \text{ mAh}$$

The number of times n1 the 10 msec counter counts during 10 seconds is 1000 (=10/0.01). On the other hand, during 20 seconds stop period of time, the number of times n2 the 10 msec counter counts is 2000 (=20/0.01) and every 10 msec, electrical quantity $\Delta M2$ is added. $\Delta M2$ in this case is −0.0111 mAh.

Accordingly, electrical quantity to be added for 30 seconds is determined by the following equation:

$$\Delta M1 \times n1 + \Delta M2 \times n2 = 44.4 - 22.2$$

$$= 22.2 \text{ mAh}$$

The number of times the drive/stop cycle is performed until the accumulated electrical quantity M exceeds the maximum value Mmax is 180 (=4000/22.2). That is, the forcible stop of the drill 40 occurs after about 90 minutes (=30 sec×180) from the start of drilling.

EXAMPLE 3

The drill 40 is driven for 10 seconds with a current of 20 Amp flowing therein and is stopped for 40 seconds. When this drive/stop cycle is repeatedly carried out, a time duration from the start of drilling to the forcible stop of the power supply is calculated.

Electrical quantity $\Delta M1$ to be added at every 10 msec interval to the accumulated electrical quantity M during 10 seconds is determined using the following equation:

$$(20 \text{ A} \times 0.01 \text{ sec}/3600) - 0.0111 \text{ mAh} = 0.0444 \text{ mAh}$$

The number of times n1 the 10 msec counter counts during 10 seconds is 1000 (=10/0.01). On the other hand, during 40 seconds stop period of time, the number of times n2 the 10 msec counter counts is 4000 (=40/0.01) and every 10 msec, electrical quantity $\Delta M2$ is added. $\Delta M2$ in this case is −0.0111 mAh.

Accordingly, electrical quantity to be added for 50 seconds is determined by the following equation:

$$\Delta M1 \times n1 + \Delta M2 \times n2 = 44.4 - 44.4$$

$$= 0 \text{ mAh}$$

The above calculations indicate that the electrical drill 40 is not forcibly stopped if 40 second non-use time is preserved after 10 second drilling. The motor heated up during the 10 second drilling time is naturally cooled down during the following 40 second non-use time.

EXAMPLE 4

A time duration from the start of drilling to the forcible stop of the power supply is calculated when the drill 40 is driven continuously with a current of 10 Amp.

Electrical quantity AM to be added at every 10 msec interval to the accumulated electrical quantity M during 10 seconds is determined using the following equation:

(10 A×0.01 sec/3600)−0.0111 mAh=0.01667 mAh

The number of times n the 10 msec counter counts during an allowable continuous driving time is 239,952 (=4000/0.01667). Therefore, about 40 minutes (=10 msec×239, 952≈2400 sec) after from the start of drilling, the power supply to the drill 40 is forcibly interrupted.

EXAMPLE 5

Assuming that the drill 40 is accidentally locked and 100 Amp load current continuously flows in the motor, the count number N is incremented every 10 msec. The time needed for the count number N becoming equal to or greater than 500 is 5 seconds (=500×10 msec). That is, after 5 seconds from the start of drilling, the power supply to the drill 40 is forcibly interrupted.

In the above-described embodiment, subtraction of Mh from the accumulated electrical quantity was made to take a natural cooling effect into account. However, a heat amount radiated from the motor is not fixed but varies depending upon the environmental temperature. The larger the difference between the motor temperature and the ambient temperature, the more is the amount of heat radiated from the motor. When it is considered that the amount of heat naturally radiated from the motor is proportional to α-th power of temperature of the motor, the temperature of the motor is proportional to β-th power of an accumulated electrical quantity supplied to the motor, and Mh is proportional to an amount of heat radiated from the motor, then the following relationship can be established:

$Mh=\beta*(\alpha\text{-th power of accumulated electrical quantity } M)$ where α and β are constants determined by the configuration and material of the motor and also by how the heat radiation is performed. By storing in a memory of the microcomputer 23 the above relationship or tables prepared based on the above relationship, the parameter Mh can be varied depending upon the accumulated electrical quantity. With the use of an appropriately varying parameter Mh, the motor temperature can be more accurately predicted, resulting in an optimal control of the electric drill.

Figure 7:
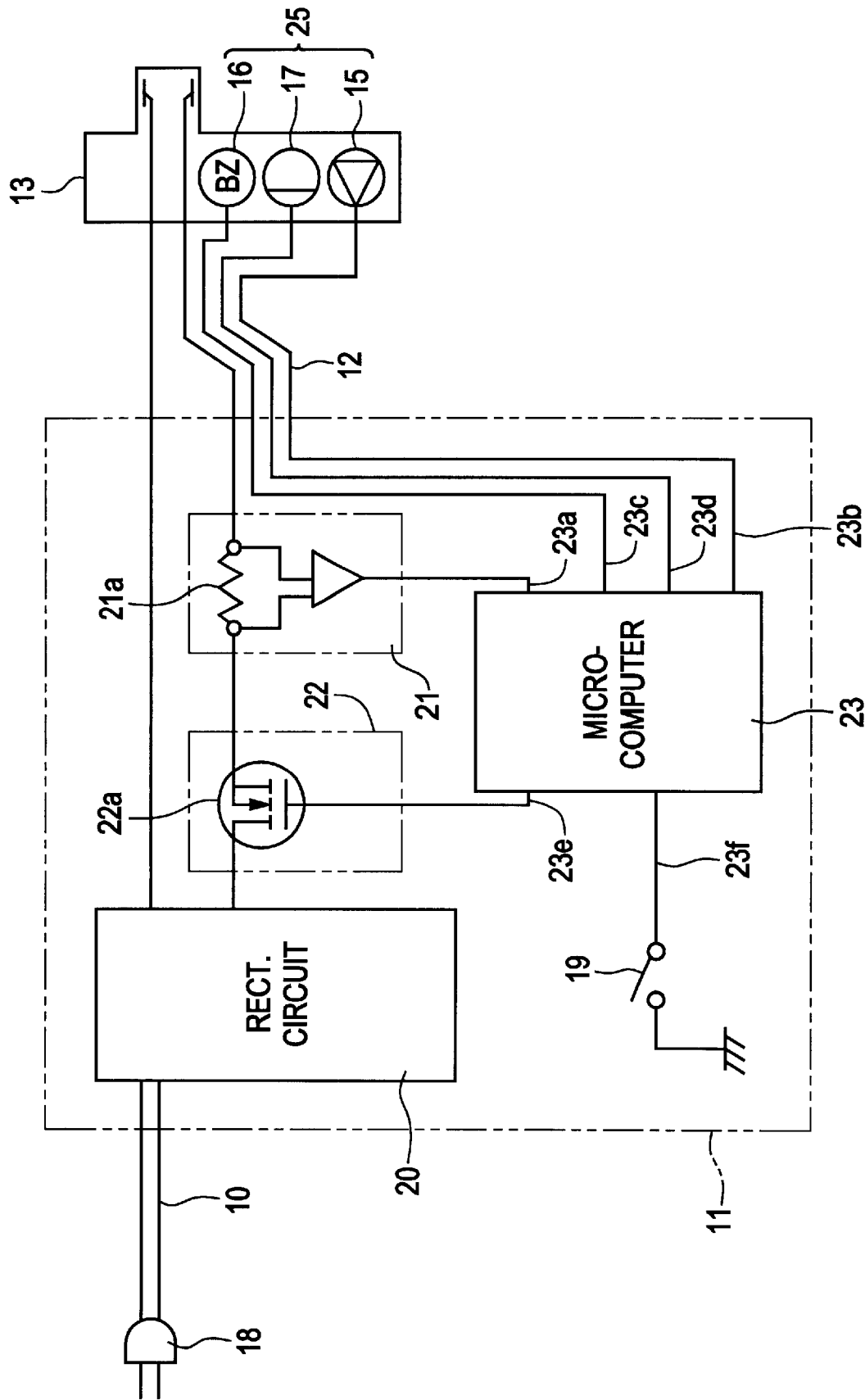
FIG. 7 is a circuit diagram of a DC power source unit according to a modification of the first embodiment of the present invention.

FIG. 7 is a modification of the arrangement shown in FIG. 3. In this modification, the alarm section 25 including the speaker 15, buzzer 16, and light 17 is provided in the adapter plug 13. By this arrangement, the user can readily recognize that the alarm section 25 is turned on.

A second embodiment of the present invention will be described while referring to FIGS. 9 and 10. The second embodiment overcomes a problem of the first embodiment such that the stored information about the accumulated electrical quantity is lost when supply of the commercial AC 100 volt power supply is interrupted or the plug 18 is disconnected from the socket. In the first embodiment, the temperature increase of the motor is predicted from the electrical quantity ΔM and the accumulated electrical quantity M is compared with the maximum value Mmax. The accumulated electrical quantity M represents the predicted current temperature of the motor. Therefore, if the accumulated electrical quantity is not available, determination as to whether or not the temperature of the motor has reached a critical condition cannot be made.

Figure 9:
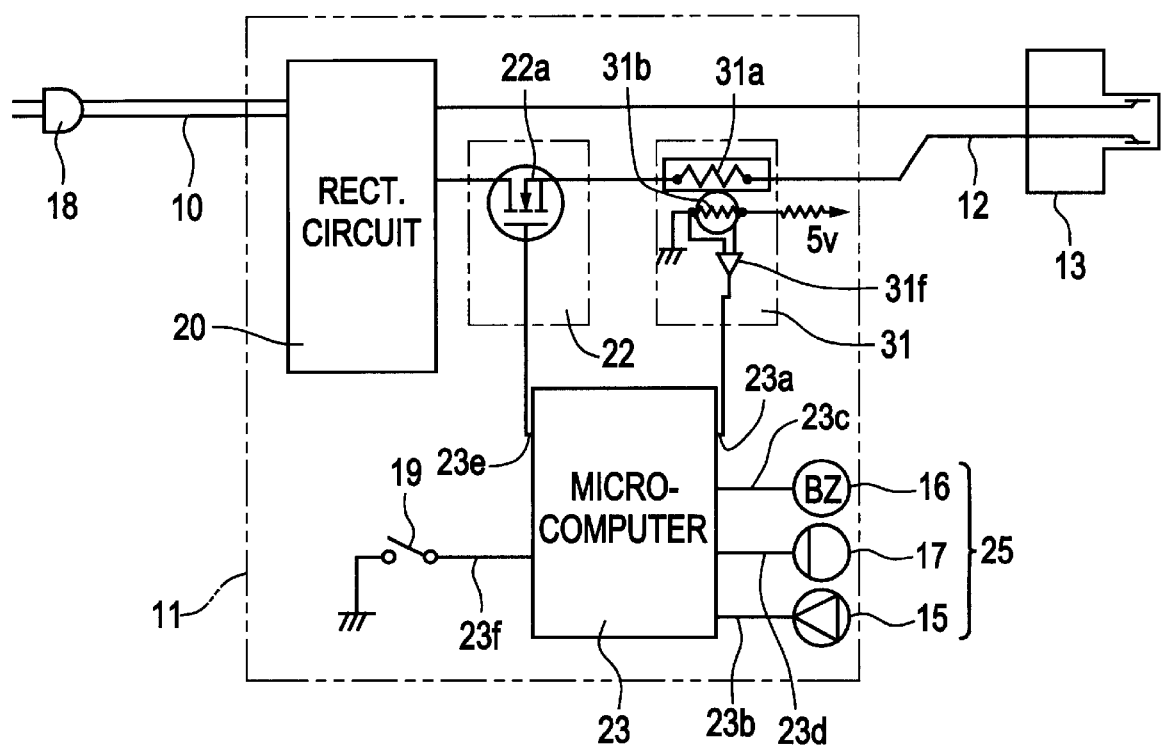
FIG. 9 is a circuit diagram of a DC power source unit according to a second embodiment of the present invention.

As shown in FIG. 9, the DC power source unit according to the second embodiment includes a temperature detection circuit 31 connected to the output of the switching circuit 22. The temperature detection circuit 31 includes a heat generating element 31a, a thermistor 31b thermally coupled to the heat generating element 31a for converting the surface temperature of the heat generating element 31a to an electrical signal, an operational amplifier 31f for amplifying the electrical signal received from the thermistor 31b. The resultant amplified signal is supplied to the microcomputer 23 through the input port 23a.

Figure 10:
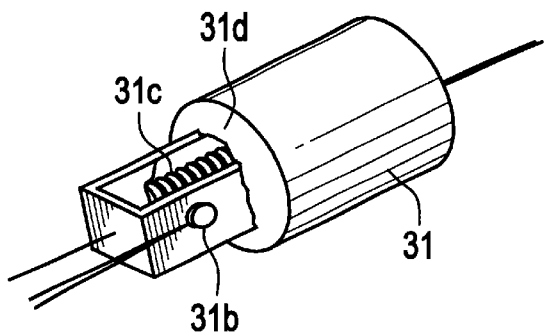
FIG. 10 is a perspective view showing a heat generating element used in the DC power source unit shown in FIG. 9 wherein a part of heat shielding material surrounding the heat generating element is cut away.

As shown in FIG. 10, the heat generating element 31a includes a ceramic member 31c sealing the heat generating element 31a with ceramic material, and a heat shielding material 31d, such as a glass wool, that covers the ceramic member 31c. The thermistor 31b is disposed in the heat shielding material 31d. The heat generating element 31a has a temperature characteristic approximately equal to the temperature characteristic of the motor. That is, the heat generating element 31a is heated up and cooled down corresponding to the temperature change of the motor contained in the electrical drill 40.

The temperature of the heat generating element 31a is compared with a predetermined temperature. Based on the comparison results, an alarm signal is generated and/or the supply of power to the electrical drill is interrupted. With such an arrangement, an optimal control can be accomplished should the commercial power supply be interrupted or the plug be disconnected from the power supply socket.

In the second embodiment, when the accumulated electrical quantity has become equal to or greater than the maximum value Mmax and/or the temperature of the heat generating element 31a has become a temperature equal to or higher than a predetermined temperature, power supply to the electric drill 40 is interrupted.

A modification is possible such that power supply is interrupted for a predetermined period of time. In this case, the reset switch 19 does not need to be manipulated. After expiration of the predetermined period of time, the accumulated electrical quantity is reduced so that driving of the electrical drill 40 can be resumed. With such a configuration, operation facility of the electrical drill is improved.

When the temporary stops of the drill occur a predetermined number of times within a prescribed period of time, the power supply to the drill can be interrupted. By so doing, the load imposed on the electrical drill 40 is lessened and lowering of the service life of the drill is minimized.

Figure 11:
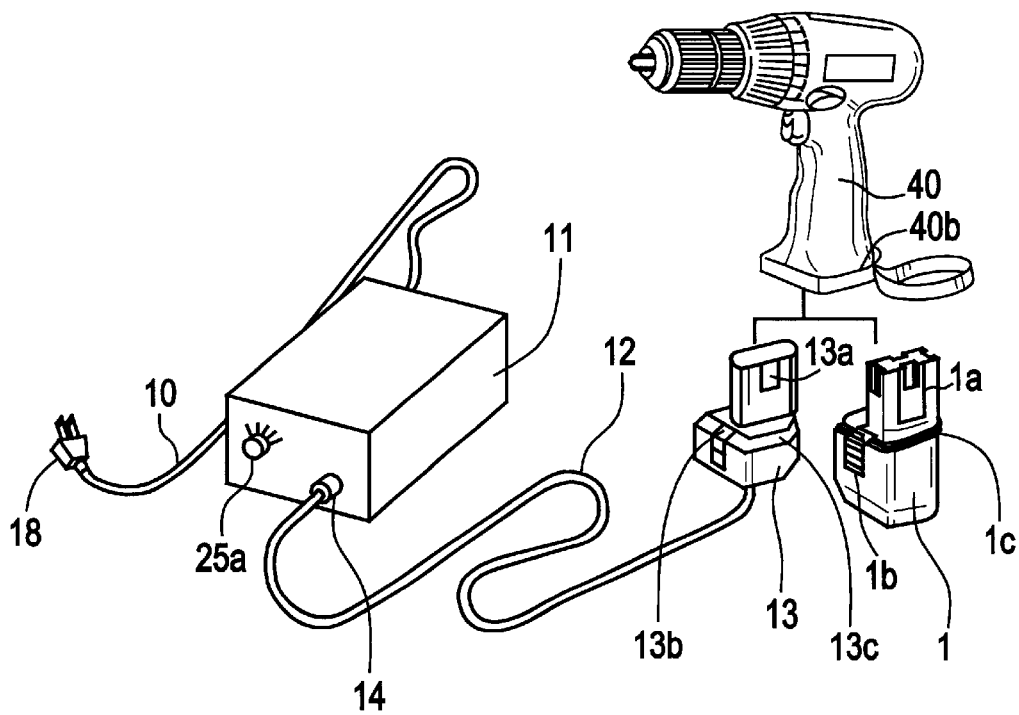
FIG. 11 is a perspective view showing the connection relationship of a power tool and a DC power source unit according to a third of the present invention.

A DC power supply unit according to a third embodiment of the present invention will be described while referring to FIGS. 11 and 12. As shown in FIG. 11, the DC power supply unit is for supplying power to an internal DC motor (not shown) of a power tool 40, represented here by a power drill. As shown in FIG. 11, the DC power supply unit has a main unit 11. An input of the main unit 11 is connected to a cable 10 and plug 18, which are for connecting the main unit 11 to an AC power supply (not shown). A connector 14 of the main unit 11 is connected to an adapter plug 13 through an output cable 12.

The power tool 40 has a battery insertion port 40b shaped for receiving a fitting portion 13c of the adapter plug 13. The adapter plug 13 has a terminal 13a where voltage is outputted, and a latch 13b for preventing the adapter plug 13 from falling out of the tool 40.

The battery insertion port 40b of the power tool 40 is also shaped for receiving a fitting portion 1c of a battery pack 1, which supplies DC voltage to the power tool 40 into which it is mounted. In other words, the fitting portion 1c of the battery pack 1 and the fitting portion 13c of the adapter plug 13 have exactly the same or substantially the same shape.

The battery pack 1 includes a terminal 1a where voltage is outputted, and a latch 1b for preventing the battery pack 1 from falling out of the tool 40.

When the plug 18 is connected to an AC power source, an AC voltage is supplied to the main unit 11 through the input cable 10. The supplied AC voltage is converted into a predetermined DC voltage by the main unit 11, and outputted to the output cable 12 and from the terminal 13a of the adapter plug 13. Therefore, the tool 40 can be used once connected to the adapter plug 13. The DC power supply unit is convenient when an AC power source is located near to the work site, and when work operations require moving the tool 40 only over short distances. In this situation, work can progress more smoothly, because by supplying power to the tool 40 using the DC power supply unit, there is no need to replace batteries while working.

Figure 12:
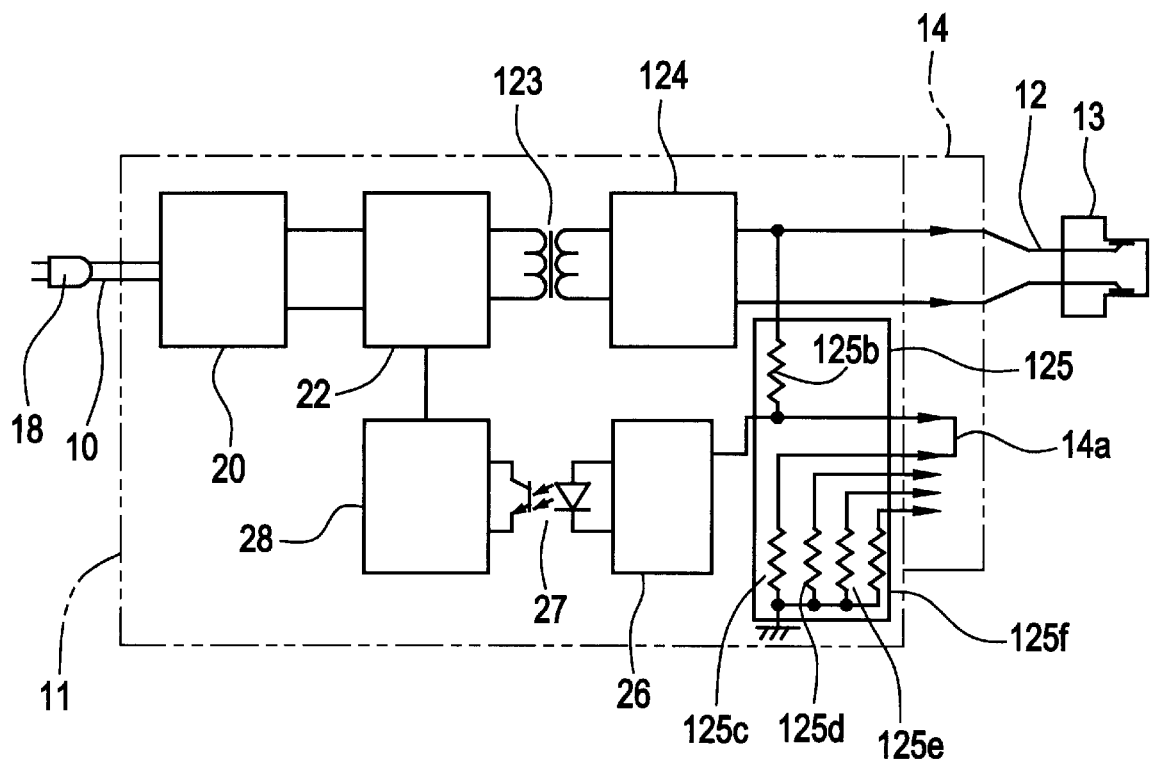
FIG. 12 is a circuit diagram showing electronic components of the DC power source unit of FIG. 11.

As shown in FIG. 12, the main unit 11 includes a rectifier circuit 20, a switching circuit 22 including an FET for example, a high-frequency transformer 123, a high-frequency rectifier circuit 124, an output voltage switching circuit 125, a constant voltage control circuit 26 connected to the output voltage switching circuit 125, and a control circuit 28. The switching circuit 22, the high-frequency transformer 123, and the high-frequency rectifier circuit 124 are for converting the inputted AC voltage to the predetermined DC voltage and outputting the DC voltage to the output cable 12. The control circuit 28 is for receiving signals from the constant voltage control circuit 26 through a photocoupler 27 and outputting control signals to the switching circuit 22 accordingly.

The output voltage switching circuit 125 includes voltage dividing resistors 125b–125f. A short-circuit terminal 14a housed inside the connector 14 selects which one of the voltage dividing resistors 125c–125f influences the outputted voltage. That is, when the connector 14 is connected to the main unit 11, the short-circuit terminal 14a connects the voltage dividing resistor 125b to a selected one of the voltage dividing resistors 125c–125f. In the example shown in FIG. 12, the short-circuit terminal 14a connects the voltage dividing resistor 125b to the voltage dividing resistor 125c. As a result, a voltage corresponding to the division rate of the voltage dividing resistors 125b, 125c develops at the input of the constant voltage control circuit 26. Based on the developed voltage, the constant voltage control circuit 26 sends a signal for setting the output voltage to the control circuit 28. The control circuit 28 operates the switching circuit 22 according to the signal, in order to produce a voltage at the high-frequency rectifier circuit 124 as determined by the constant voltage control circuit 26.

In this way, the voltage outputted from the main unit 11 depends on the connector 14 attached thereto. With the above-described configuration, a single main unit 11 can be used to power a variety of different power tools 40, with different rated voltages. That is, the short-circuit terminal 14a selects the voltage dividing resistor 125c–125f that corresponds to the subject tool 40, and the output voltage is set accordingly. Therefore, by preparing connectors that select different ones of the voltage dividing resistors 125c–125f, a variety of different voltages, such as 9.6 V, 14.4V, 18V, or 24V, can be produced. By selecting the appropriate connector 14, a voltage can be produced that matches the output of the battery pack adapted for use in the target cordless power tool. In other words, by using the connector 14 with the short-circuit terminal 14a suitable for the rated voltage of the subject power tool 40, the output voltage can be automatically switched according to the rated voltage of the power tool 40.

The cable 12, the adapter plug 13, and the connector 14 are formed integrally together. Because the adapter plug 13 is shaped to fit into only the insertion port of a power tool 40 with a corresponding rated voltage, there is no danger of a user accidentally connecting an inappropriate adapter plug 13 to the power tool 40. As a result, an output voltage that corresponds to the rated voltage of the subject power tool 40 can be reliably applied to the power tool 40. Also, safety is enhanced.

Figure 13:
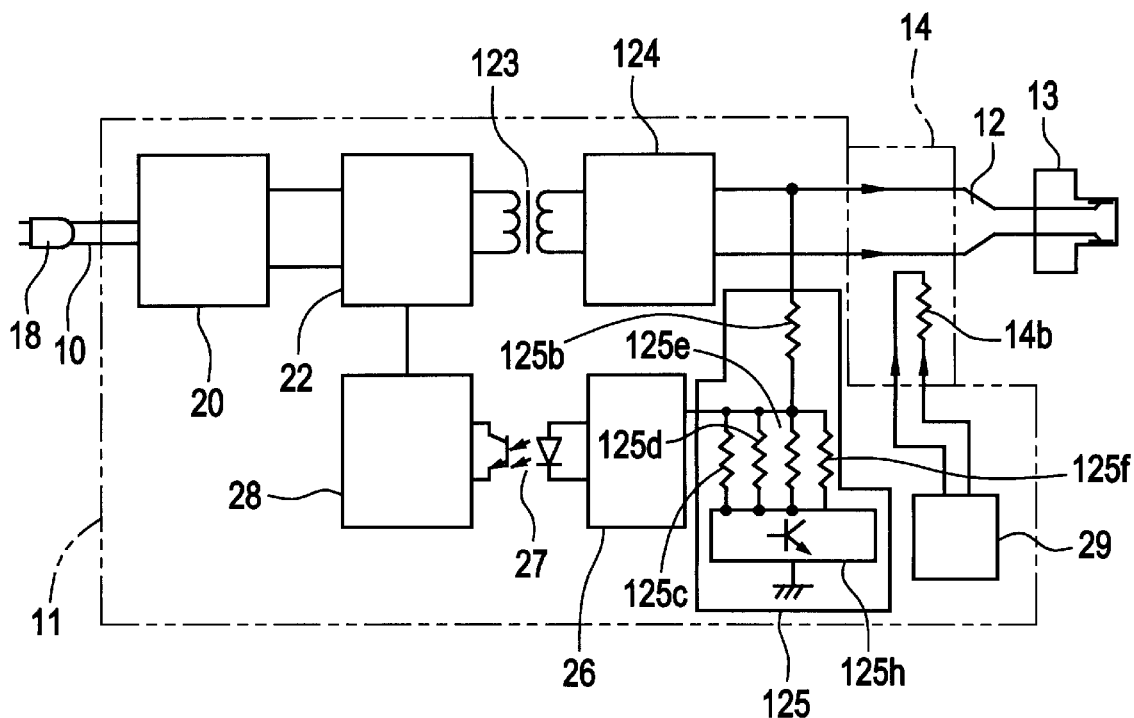
FIG. 13 is a circuit diagram showing electronic components of a DC power source unit according to a fourth embodiment of the present invention.

Next, a DC power supply unit according to a fourth embodiment of the present invention will be described while referring to FIG. 13. As shown in FIG. 13, the configuration of the DC power supply unit of the fourth embodiment is similar to that described in the third embodiment, but has no short-circuit terminal 14a. Instead, the DC power supply unit of the fourth embodiment includes an output voltage setting resistor 14b, a setting voltage detecting unit 29, and a transistor array 125h. The output voltage setting resistor 14b is housed inside the connector 14, which is connected to the output cable 12. The setting voltage detecting unit 29 is for outputting a signal, that depends on the value of the resistor 14b, to the transistor array 125h.

When the connector 14 is connected to the main unit 11, and the plug 18 is connected to an AC power source, the setting voltage detecting unit 29 senses the resistance value of the output voltage setting resistor 14b and outputs a signal to the transistor array 125h, that instructs the transistor array 125h to connect a corresponding one of the voltage dividing resistors 125c–125f to ground. As a result, the output voltage can be changed in the same manner as using the configuration described with reference to FIG. 12. That is, the voltage outputted from the main unit 11 can be set to a desired value by setting the value of the output voltage setting resistor 14b.

Figure 14:
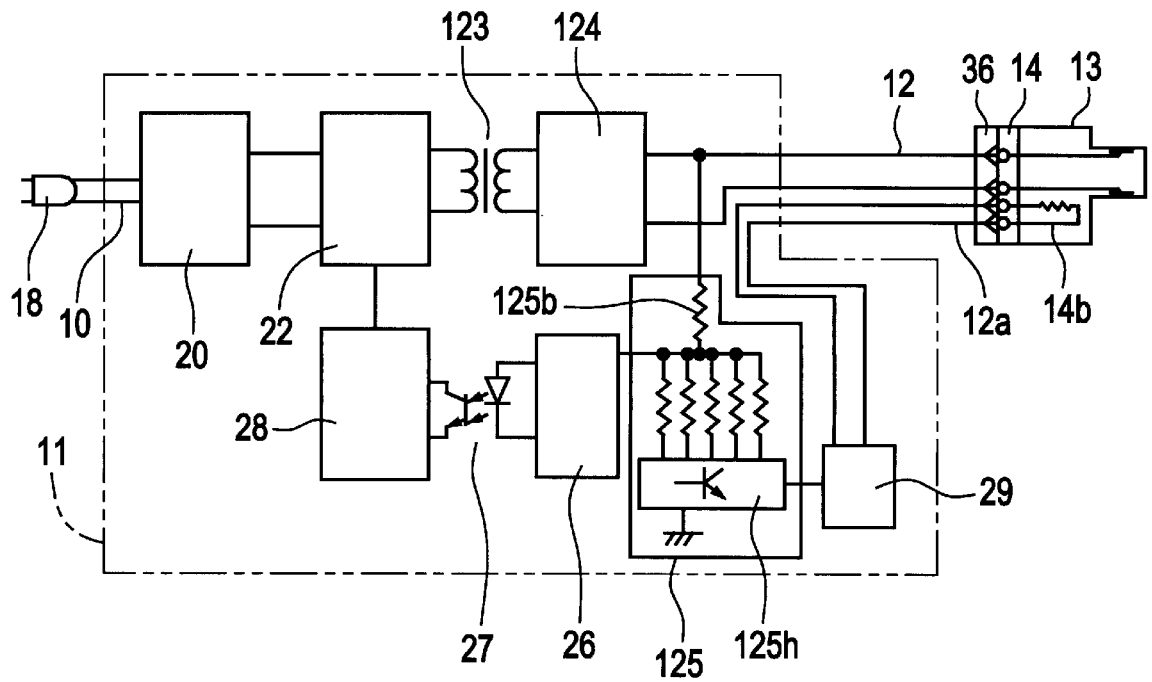
FIG. 14 is a circuit diagram showing electronic components of a DC power source unit according to a fifth embodiment of the present invention.
Figure 15:
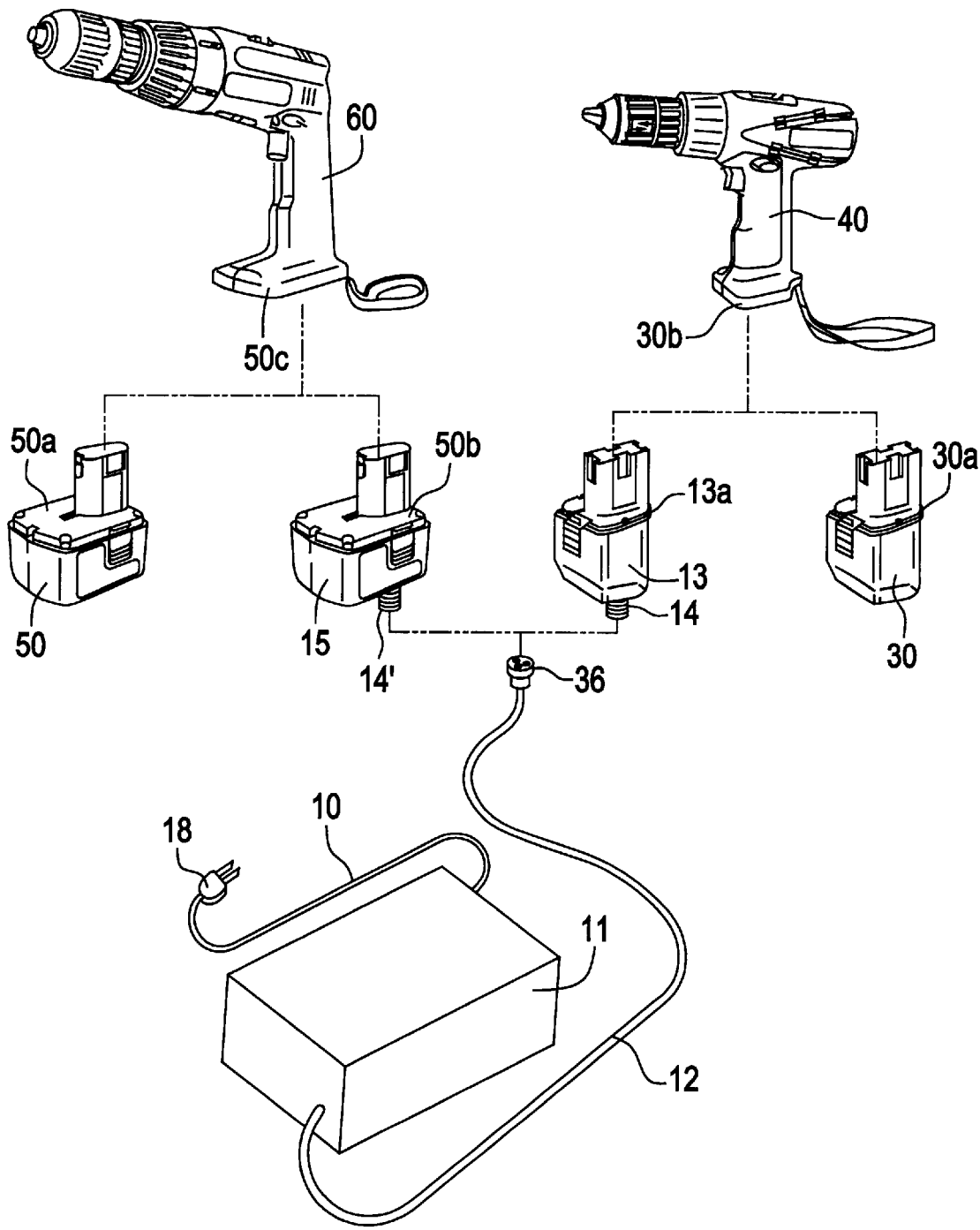
FIG. 15 is a perspective view showing the connection relationship of two different power tools and the DC power source unit shown in FIG. 14.

FIGS. 14 and 15 show a DC power supply unit according to a fifth embodiment of the present invention. As shown in FIG. 14, the output cable 12 from the main unit 11 has four lines, including a signal transmission line 12a of a positive power source. The connector 14 is incorporated into the adapter plug 13, and a connector 36 is connected to the end of the cable 12, so that the adapter plug 13 is freely detachable with respect to the output cable 12. The output voltage setting resistor 14b is housed inside the adapter plug 13 at a position for connection with the signal transmission line 12a when the cable 12 and the adapter plug 13 are connected together.

FIG. 15 is a perspective view showing the relationship between the box-shaped main unit 11 shown in FIG. 14, and two power tools 40, 60. The DC power source unit can be used with a variety of different power tools, such as the power screw driver 40, which has a rated voltage of 12V, and a drill 60, which has a rated voltage of 14.4V. The power tools 40, 60 are provided with battery insertion ports 30b and 50c, respectively. The battery insertion port 50c is shaped to receive a fitting portion 50a of a 14.4V battery 50. The battery insertion port 30b is shaped to receive a fitting portion 30a of a 12V battery 30.

The adapter plug 15 has a fitting portion 50b with exactly the same or substantially the same shape as the fitting portion 50a of the battery 50. In other words, both the fitting portions 50a, 50b are insertable and connectable with respect to the battery insertion port 50c. In other words, the power tool 60 can be driven using either the battery 50 or the main unit 11, by selecting which of the fitting portions 50a, 50b is inserted in the battery insertion port 50c.

Also, the fitting portions 50a, 50b of the battery 50 and the 14.4V adapter plug 15 are formed with a different shape, size, or both than the fitting portions 13a, 30a of the 12V adapter plug 13 and the battery 30. For example, the fitting portions 50b, 50a of the 14.4V adapter plug 15 and the battery 50 can be formed with a square shape, and the fitting portions 13a, 30a of the 12V adapter plug 13 and the battery 30 can be formed with a pentagonal shape. With this configuration, neither the 14.4V battery 50 nor the adapter plug 15 can fit in the battery insertion port 30b of the 12V power tool 40. Also, neither the 12V battery 30 nor the adapter plug 13 can fit in the battery insertion port 50c of the 14.4V power tool 60. Therefore, a user can not accidentally connect the wrong power supply to a power tool. The power tools 60, 40 can be prevented from burnout or other damage that could be caused when driven using the wrong voltage.

The adapter plugs 15, 13 are provided at their bases with connectors 14', 14, respectively. Both of the connectors 14', 14 are capable of detachably connecting with the same connector 36 of the output cable 12. However, the connectors 14', 14 differ from each other by the resistance value of the output voltage setting resistor 14b disposed therein. That is, the resistor 14b of the connector 14' has a different resistance than the resistor 14b of the connector 14. Each resistor 14b to be used in the connectors 14, 14' is selected for resistance value that corresponds to the voltage desired to be output from the main unit 11. Because the connector 36 can be connected to any of the adapter plugs 15, 13, and because the resistor 14b for determining desired voltage is disposed in the adapter plugs 15, 13, the same main unit 11 can be used to supply power to power tools with different voltage requirements.

Said differently, the same output cable 12 can be used for either of the power tools 40, 60, even when the power tools 40, 60 use different rated voltages. Only the adapter plug 13 needs to be changed according to the type of power tool. This is very cost effective. Because the shapes of the adapter plugs 13, 15 are determined by the type of voltage to be supplied to the corresponding power tool, there is no danger that an incorrect voltage will be supplied to the power tools 40, 60. Because the applied voltage is automatically selected by the output voltage setting resistor 14b in the adapter plugs 13, 15, there is need to provide a switch to change voltage. Also, there is no danger of such a switch being accidentally and mistakenly activated.

A sixth embodiment of the present invention will be described while referring to FIGS. 16 and 17. The sixth embodiment is directed to a DC power source unit including an output voltage setting unit that sets an output voltage applied to the electrical drill 40.

Figure 16:
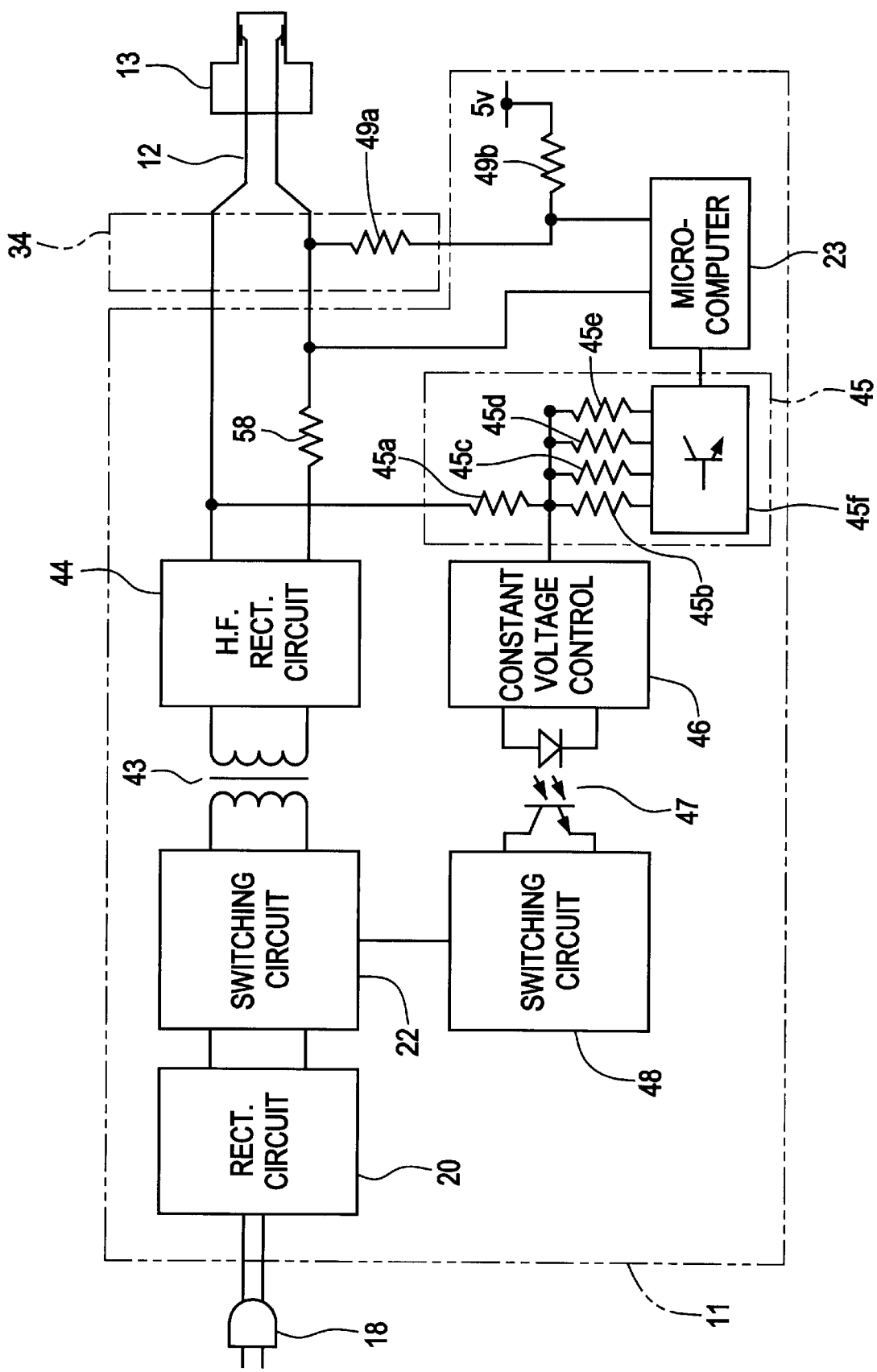
FIG. 16 is a circuit diagram of a DC power source unit according to a sixth embodiment of the present invention.

As shown in FIG. 16, the main unit 11 of the DC power source unit includes a rectifying circuit 20, a switching circuit 22, a high frequency transformer 43, and a high frequency rectifying circuit 44. The main unit 11 further includes an output voltage changeover circuit 45, a constant voltage control circuit 46 having an input connected to the output of the voltage changeover circuit 45, a photocoupler 47, and a switching control circuit 48 having an input connected to the constant voltage control circuit 46 through the photocoupler 47. The switching control circuit 48 produces a control signal in response to the signal output fed from the constant voltage control circuit 46 and transmitted through the photocoupler 47. The control signal is output to the switching circuit 22. The main unit 11 also includes a microcomputer 23. Although not shown in the drawing, the microcomputer 23 includes a central processing unit (CPU), a read-only memory (ROM), a random access memory (RAM), a timer, input ports, output ports, and A/D converters. The microcomputer 23 has an input port connected to a 5 volt power supply through a voltage dividing resistor 49b and another input port connected to one end of a load current detecting resistor 58 whose another end is connected to the output of the high frequency rectifying circuit 44.

The output voltage changeover circuit 45 includes a resistor network consisting of resistors 45a through 45e, and a transistor array 45f. The transistor array 45f connects one or more of the resistors 45b through 45e to ground in response to the output from the microcomputer 23.

An output voltage setting resistor 49a is provided in a connector 34 attached to one end of the output cable 12. The resistor 49a has a resistance value corresponding to a rated voltage of the tool. When the output cable 12 of the tool is connected to the main unit 11 through the connector 34, the output voltage setting resistor 49a is connected to both the microcomputer 23 and the resistor 49b.

Operation of the DC power supply unit thus constructed will be described while referring to the flowchart shown in FIG. 17.

When the plug 18 is inserted into the commercial AC 100V power supply socket, the microcomputer 23 starts executing the program (S300). Next, the microcomputer 23 detects a voltage at a connection between the resistors 49a and 49b. The voltage thus detected is subjected to an A/D conversion by means of the A/D converter contained in the microcomputer 23 (S301). The resultant digital signal is stored in the RAM as an output voltage instruction value Vcmd and is also applied to the transistor array 45f of the output voltage changeover circuit 45 (S302). In response to the signal fed from the microcomputer 23, the transistor array 45f selectively grounds one or more of the resistors 45b through 45e. According to the voltage division ratio determined by the resistors grounded, the output voltage changeover circuit 45 divides the voltage developed at the output of the high frequency rectifying circuit 44 and applies the resultant voltage to the constant voltage control circuit 46.

Next, the microcomputer 23 waits for 10 msec (S304) and then detects the output of the load current detecting resistor 58. The load current thus detected is subjected to an A/D conversion (S305). Thereafter, whether the load current is zero or not is determined (S306). When the load current is not zero (S306: No), the routine proceeds to S310 where the microcomputer 23 waits for another 10 msec. Thereafter, the routine returns to S305.

When the determination made in S306 indicates that the load current is zero (S305: Yes), then the voltage at the connection of the resistors 49a and 49b is again detected and the detected voltage is subjected to an A/D conversion (S307). The resultant digital signal is compared with the output voltage instruction value Vcdm (S308). When the comparison result indicates that the two values are the same (S308: Yes), the routine proceeds to S310 where the microcomputer 23 waits for 10 msec, whereupon the routine returns to S305.

When the comparison made in S308 indicates that the later detected voltage is different from the earlier detected voltage, that is, the output voltage instruction value Vcmd (S308: No), the microcomputer 23 determines that a different electrically powered tool with a different rated voltage is connected to the main unit 11. In this case, the routine proceeds to S309 where the output voltage is set upon executing the same processes in S301 and S302.

With the above-described arrangement, when a high level current is not flowing into the tool, then the microcomputer 23 controls the output voltage changeover circuit 45 according to the voltage developed across the output voltage setting resistor 49a. As a result, noise components are not superimposed on the signal derived from the resistor 49a and therefore a stable output voltage can be applied to the tool 40. The output voltage setting resistor 49a is provided in the connector 34 attached to one end of the output cable 12, so that a signal line for transmitting the signal derived from the output voltage setting resistor 49a does not need to be included in the output cable 12. The output cable 12 can thus be light in weight and manufactured at a low cost. On the other hand, in an arrangement of the type in which the output voltage setting resistor is provided in the adapter plug 13 that is attached to another end of the output cable 12, a signal line for transmitting the signal derived from the output voltage setting resistor needs to be additionally provided in the output cable 12.

While several exemplary embodiments of this invention have been described in detail, those skilled in the art will recognize that there are many possible modifications and variations which may be made in these exemplary embodiments while yet retaining many of the novel features and advantages of the invention. Accordingly, all such modifications and variations are intended to be included within the scope of the appended claims. For example, in the first embodiment, the FET 22a allows and interrupts the supply of current to the electrical drill 40 under the aegis of the microcomputer 23, other switching element, such as a relay, may be used in lieu of the FET 22a. Further, such switching element may be provided in the rectifying circuit 20.

The heat generating element 31a used in the second embodiment is not limited to the one shown in FIG. 10 but it can be any shape and any structure insofar as it exhibits a temperature characteristic similar to the electrically powered tool subjected to temperature monitoring.

In the first, second, and sixth embodiments, the main unit 11 and the output cable 12 may be fixedly connected and the adapter plug 13 may be detachably connected to the output cable 12. When the sixth embodiment is modified in such a manner, a signal line for transmitting the signal on the output voltage setting resistor needs to be provided in the output cable 12.

In the sixth embodiment, the microcomputer 23 controls the output voltage changeover circuit 45 according to the signal from the output voltage setting resistor 49a when the load current detected by the resistor 58 is zero. This can be modified so that the microcomputer 23 controls the output voltage changeover circuit 45 according to the signal from the output voltage setting resistor 49a when the motor is rotating with no load wherein a relatively low level current is flowing in the motor which may be 2 Amp to 5 Amp.

According to the present invention, the adapter plug attached to the end of the output cable has a fitting portion shaped the same as the fitting portion of a battery to be used with the same power tool. With this configuration, the power tool can be powered either by batteries or by the DC power source, depending on the work circumstances.

Also, because the voltage outputted by the DC power source unit can be changed, the DC power source unit can be used with a variety of different power tools with different rated voltages.

An output voltage setting means (resistor 14b) is provided in the connector that connects the output cord to the main unit. Because the output voltage is changed using such a setting means, the main unit can be automatically switched to output a voltage that corresponds to the rated voltage of the subject power tool.

Because the battery insertion port is compatible with, that is, has a shape, size, or both that matches, the fitting portion of only a battery or adapter for supplying the appropriate voltage, there is no danger of an operator using the wrong adapter or battery with the wrong power tool. Therefore, power tools will never be supplied with the wrong voltage.

What is claimed is:

1. A DC power source unit for supplying DC voltage to an electrically powered tool, the DC power source unit comprising:
    a main unit that has an output and produces DC voltage from the output;
    an adapter plug that is electrically coupled to the electrically powered tool in use;
    a connector that is electrically connected to the output of said main unit;
    an output cable having one end attached to said adapter plug and another end attached to said connector;
    output voltage setting means, provided in said adapter plug, for setting a level of voltage to be supplied to the electrically powered tool, the level of voltage set by said output voltage setting means corresponding to a rated voltage of the electrically powered tool;
    load current detection means for detecting an instant load current flowing in the electrically powered tool and outputting a detection signal indicative of the load current;
    output voltage changeover means for changing over the level of voltage to be supplied to the electrically powered tool in response to the level of voltage set by said output voltage setting means; and
    control means for controllably transmitting the level of the voltage set by said output voltage setting means to said output voltage changeover means, based on whether the detection signal output from said load current detection means indicates that the instant load current is equal to or less than a predetermined load current.

2. The DC power source unit as claimed in claim 1, wherein the adapter plug is detachably connected to the one end of the output cable.

3. The DC power source unit as claimed in claim 2, wherein said output voltage setting means comprises a resistor.

4. The DC power source unit as claimed in claim 1, wherein the predetermined load current is zero.

5. The DC power source unit as claimed in claim 1, wherein the predetermined load current is in a range of 2 Amp to 5 Amp.

6. A DC power source unit for supplying DC voltage to a cordless electrically powered tool, the electrically powered tool having a battery insertion port adapted to electrically couple with a fitting portion of a battery pack, the DC power source unit comprising:
    a main unit that has an output and that supplies DC voltage from the output;
    an adapter plug having a fitting portion adapted for electrically coupling with the battery insertion port of the electrically powered tool, the adapter plug housing therein a voltage setting means for setting a rated voltage of the electrically powered tool;
    an output cable having one end attached to said main unit and another end engaged with the adapter plug;
    output voltage switching means for switching a level of voltage supplied by the main unit to the electrically powered tool, to a level that matches rated voltage of the electrically powered tool that the fitting portion of the adapter plug is adapted to electrically couple with, the output voltage switching means including a plurality of resistors connected in parallel, wherein at least one of the plurality of resistors is selected upon connection of the adapter plug to the main unit through the output cable and in response to the voltage setting means, a selected resistor determining the level of voltage supplied by the main unit.

7. A DC power source unit as claimed in claim 6, further comprising:

a plurality of adapter plugs provided in a one-to-one correspondence with a plurality of electrically powered tools, each adapter plug being shaped to enable coupling with a corresponding electrically powered tool that has a corresponding rated voltage, and being shaped to prevent coupling with all non-corresponding electrically powered tools that have a non-corresponding rated voltage; and a connector for detachably connecting the cable to each adapter plug, the connector being adapted to connect to all adapter plugs regardless of the rated voltage of the corresponding electrically powered tool.

* * * * *